United States Patent [19]
Chishima

[11] Patent Number: 5,839,916
[45] Date of Patent: *Nov. 24, 1998

[54] DEVICE FOR CONNECTING A FLAT CABLE TO A WIRING BOARD

[75] Inventor: Masamitsu Chishima, Yokkaichi, Japan

[73] Assignee: Sumitomo Wiring Systems, Ltd., Japan

[*] Notice: The portion of the term of this patent subsequent to May 9, 2015, has been disclaimed.

[21] Appl. No.: 437,364

[22] Filed: May 9, 1995

[30] Foreign Application Priority Data

May 31, 1994 [JP] Japan ................................. 6-142667

[51] Int. Cl.$^6$ .................................................. H01R 9/07
[52] U.S. Cl. ............................................................ 439/495
[58] Field of Search ..................... 439/260, 267, 439/329, 492, 493, 494, 495

[56] References Cited

U.S. PATENT DOCUMENTS

| | | | |
|---|---|---|---|
| 4,734,053 | 3/1988 | Imai | 439/329 |
| 4,778,403 | 10/1988 | Ikesugi et al. | 439/329 |
| 5,308,262 | 5/1994 | Chishima | 439/495 |

*Primary Examiner*—David L. Pirlot
*Assistant Examiner*—Yong Kim
*Attorney, Agent, or Firm*—Jordan B. Bierman; Bierman and Muserlian

[57] ABSTRACT

A device for connecting a flat cable to a wiring board in which the cable is composed of a plurality of layers. A first insulating layer carries a shield foil layer upon which a central insulation layer is placed. A plurality of conductors, parallel to each other and spaced apart transversely, are on the central layer and, in turn, are covered by a second insulating layer. The cable has a connecting end wherein the first layer and second layer are absent, thus exposing portions of the conductors and the shield layer for making contact with the device.

The device itself is made up of a housing containing a series of cavities which correspond to the conductors. Each cavity contains a fixed terminal. The terminals project out of the cavities and contact the wiring board. The other ends of the contacts have a pressing element and a terminal contact. A slide plate is introduced between the pressing element and an interior of the housing, whereby the terminal contact is urged firmly against the conductors, thereby forming a good electrical connection.

A holder is also provided in the housing on the shield foil layer side of the cable. Thus, the slide plate, after installation, forces the fixed terminals and the cable against the inner wall of the housing, thereby ensuring that good electrical contact is made for both circuits.

11 Claims, 11 Drawing Sheets

DEVICE FOR CONNECTING A FLAT CABLE TO A WIRING BOARD

This Application claims the priority of Japanese Application 6/142,667, filed May 31, 1994.

The present Invention is directed to a device for securing a shielded flat cable to a wiring board.

BACKGROUND OF THE INVENTION

There are situations, especially in the case of a liquid crystal display panel, wherein a flat cable is to be placed in a narrow available space. In such situations, it is often desirable to provide a shield which will reduce noise or prevent erroneous operation. It has been the accepted practice to secure the connector to a wiring board, preferably printed, and then to allow the connector to engage the cable.

Referring specifically to FIGS. 21 and 22, a plurality of foil conductors 142 for (for example) signal transmission are located parallel to each other on the upper surface of first insulation sheet 141. Laminated sequentially thereon are first insulation layer 143, shield foil layer 144, and second insulation layer 145. Shield layer 144 is electrically conductive and is preferably aluminum, copper, or the like. At the connecting end of cable 140, first and second insulation layers 143 and 145 terminate short of the end of the cable, thereby exposing conductors 142 and shield foil 144. Adjacent one edge of cable 140 is shield end piece 144a which is of the same length as conductors 142, and is also on the upper face of first insulation layer 141 and in parallel with conductors 142.

The wiring board (not shown) comprises a plurality of parallel signal contacts and a ground contact at the end of a grounding circuit. The latter is parallel to—and to one side of—the signal contacts. The board also has provision for mounting a holder thereon, affixed thereto by soldering. The device for connecting the flat cable with the wiring board comprises a plurality of contacts corresponding to the signal contacts on the board, as well as a ground for the shield foil. Each of the contacts, including the ground, is soldered to its corresponding contact on the wiring board.

However, the foregoing construction suffers from certain disadvantages. Specifically, it is necessary to arrange shield foil end piece 144a on first insulation layer 141 parallel to conductors 142. Thus, the very narrow end piece 144a is difficult to work with and to label. Moreover, since end piece 144a is spaced apart from conductors 142 in the transverse direction, cable 140 is necessarily made wider as a result. Therefore, the connecting device itself must also be enlarged.

SUMMARY OF THE INVENTION

The present Invention is intended to solve the foregoing problems and, therefore, it is an object of the present Invention to provide a connecting device which is easy to install and requires less transverse space than the prior art devices. The flat cable includes a first insulating layer, a shield foil layer thereon, a central insulation layer on the shield foil layer, a plurality of conductors, parallel to each other, on the central layer, and a second insulating layer on the conductors. At the connecting end of the cable, the first and second layers terminate at a point spaced longitudinally away therefrom, thus forming exposed portions of the conductors and the shield layer.

The connecting device includes a housing and a slide which is adapted to enter therein. There are a plurality of cavities in the housing which correspond to the conductors. The cavities extend forwardly and are in communication with an insertion space. The cavities contain a plurality of fixed terminals, one in each of the cavities. Each of the fixed terminals includes a wiring board contact which projects out of one of the cavities. There is a pressing element in the insertion space and spaced apart from the inner surface thereof. A terminal contact is electrically connected to the pressing element and is located forward thereof.

The housing also contains a holder having a first contact which forms an electrical connection with the wiring board. The holder has a second contact which is adjacent the insertion space on the side of the pressing element remote from the inner surface, there being an electrical connection between the first and second contacts.

The exposed portions of the cable are between the pressing element and the second contact, and the slide plate is between the pressing element and the inner surface. As a result of the foregoing construction, the slide plate urges the pressing element against the corresponding conductor, whereby the wiring board contact pressing element and the terminal contact are electrically connected to each of the conductors.

The wiring board carries a plurality of circuit contacts corresponding to the plurality of conductors and in electrical contact with the wiring board contacts. The wiring board also carries a ground contact which corresponds to the first contact and is in electrical contact therewith. The ground contact is the terminal of a grounding circuit. Preferably, the wiring board contacts and the holder are soldered to the wiring board.

To assist in securing the slide plate in its appropriate positions, there are arms thereon which enter guide grooves on the external sides of the housing. Initial stops are provided in the grooves which retain the arms and the slide plate in their initial position. In this condition, the cable is inserted between the pressing element and the second contact on the holder. Thereafter, the slide plate is pressed further into the housing to a normal position with respect thereto. The guide grooves contain normal stops, rearward of the initial stops, which are engaged by the arms and retain the slide plate in the normal position.

In a particular embodiment of the present Invention, the housing has a generally planar, holder-receiving surface therein. The holder is generally planar and has a pair of legs depending therefrom at each side. There are complementary leg grooves which receive the legs as the device is moved into its initial and normal positions. An end of each of the legs remote from the planar holder constitutes the second contact. In a particularly preferred form of the device, the legs carry friction stops which bear against the inside of the housing to resist or impede withdrawal of the slide plate from the housing.

In another desirable embodiment of the present Invention, the holder is a planar body having holder legs depending from each side thereof. At the end of each of the holder legs remote from the planar body, the holder contact, parallel to the body and spaced apart therefrom by the holder legs, is formed.

BRIEF DESCRIPTION OF THE DRAWINGS

In the accompanying drawings, constituting a part hereof.

DETAILED DESCRIPTION OF THE INVENTION

Referring specifically to FIGS. 1 to 10, wiring board 1 carries a plurality of circuit contacts 11 spaced apart transversely to the longitudinal axis of board 1 and parallel to each other. Each contact 11 is connected to an appropriate circuit (not shown). Forward of circuit contacts 11 (to the right in FIG. 1), ground contact 12 is connected to a grounding circuit (not illustrated) wired to wiring board 1.

Figure 6:
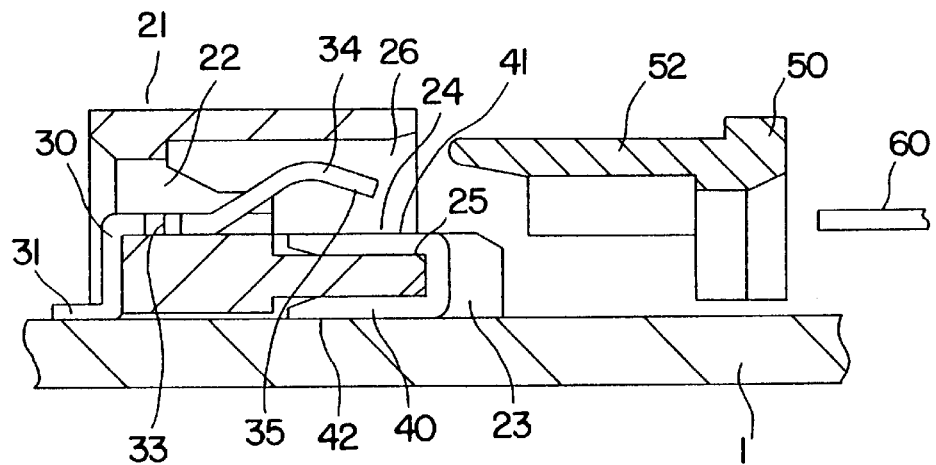
FIG. 6 is a cross section of the device before the slide plate is introduced into the housing.

As can be seen in FIG. 6, connecting device 2 comprises housing 21, a plurality of fixed terminals 30 in housing 21, holder 40 affixing housing 21 to wiring board 1, and slide 50 carrying slide plate 52 for securing flat cable 60 to connecting device 2. Housing 21 is of insulating material and comprises a plurality of cavities 22 in each of which a fixed terminal 30 is located. Wiring board contact 31 extends out of cavity 22 in the rearward direction. Within the cavities, fixed terminals 30 extend forwardly and comprise pressing portion 34 and end in terminal contact 35. Support 23 extends forwardly from the bottom face of cavity 22, the upper face thereof being flush with the bottom face of cavity 22, thereby forming support face 24. Centered transversely on supporting part 23 is holder recess 25, adapted to receive holder 40. Insertion space 26 is located above support 23.

On either side of housing 21, guide grooves 27 extend longitudinally, and are provided with initial stops 28 and normal stops 29. Thus, slide 50, along with slide plate 52, can be placed in an initial position, retained by initial stops 28, and a normal position, retained by normal stops 29.

Each terminal 30, made of conductive materials, is bent into a crank shape, as shown in FIG. 6. The lower face of its rear is formed into wiring board contact 31 which, in turn, is electrically connected to the corresponding circuit terminal 11 on wiring board 1. The intermediate part of terminal 30 rests on the bottom face of cavity 22, and friction pieces 33 are forced into the side wall of cavity 22 to fix terminals 30 therein. Pressing portion 34, spaced apart from the upper inner wall of insertion space 26, is located forwardly of the intermediate part. As slide plate 52 enters the space between pressing portion 34 and the inner surface of space 26, pressing portion 34 is forced downwardly, terminal contact 35 makes a secure contact with conductor 62 of cable 60, and shield foil 64 makes good contact with second contact 41.

Thus, terminals 30 are set in cavities 22, wire board contacts 31 are flush with the lower face of housing 21, and terminal contact 35 is so located that the connecting end of cable 60 can be inserted between terminal contact 35 and second contact 41. Insertion of slide plate 52 forces pressing element 34 downward to provide excellent electrical contact between terminal contact 35 and corresponding conductor 62 of cable 60, as well as between shield foil 64 and second contact 41.

Holder 40 is formed of conductive material and comprises second contact 41 and first contact 42 which are electrically connected. Second contact 41 is in electrical contact with the shield foil layer on the connecting end of cable 60. Thus, holder 40 completes an electrical circuit from shield foil layer 64 to ground contact 12. In an advantageous form of this embodiment, the various contacts are soldered to the wiring board.

Figure 1:
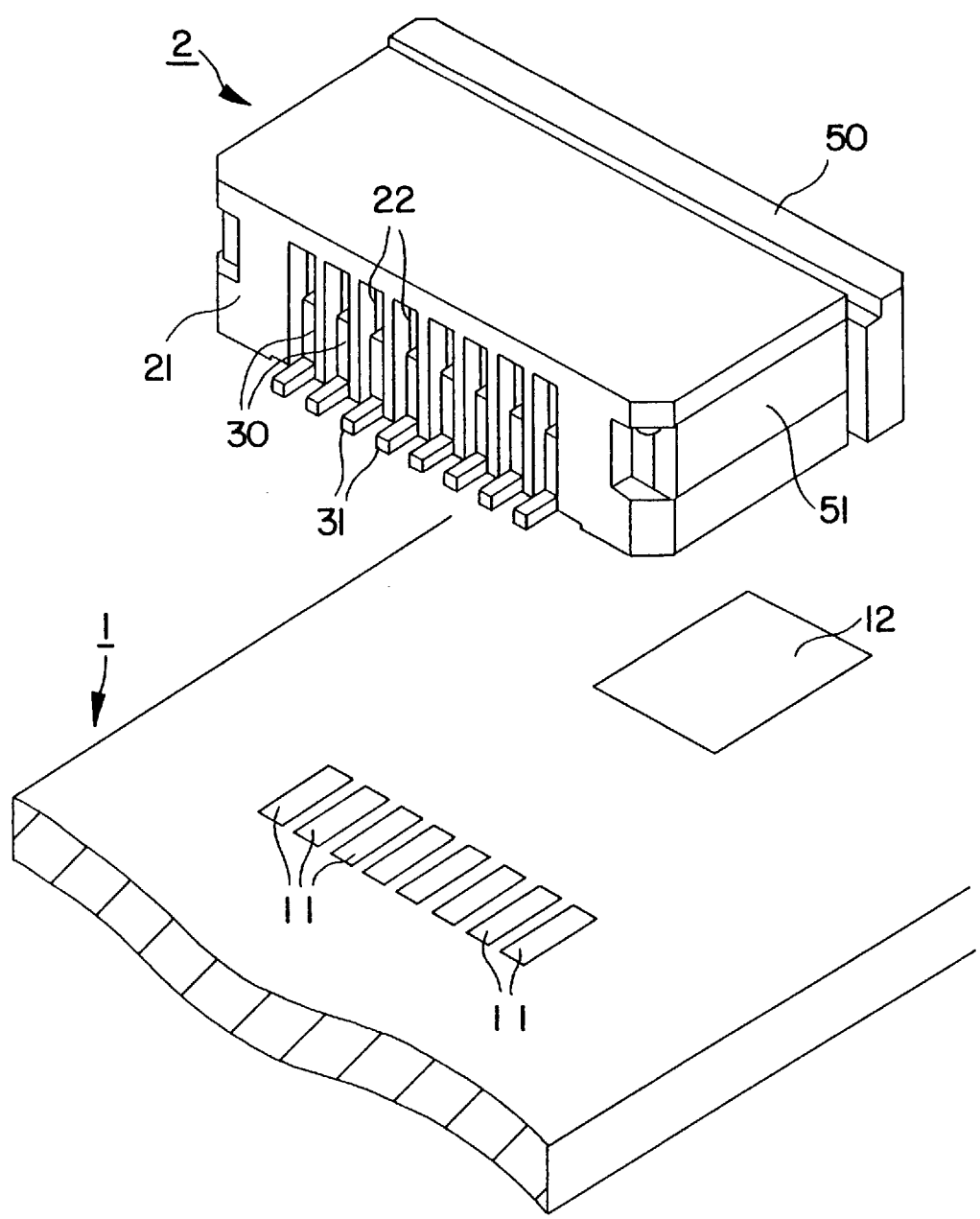
FIG. 1 is an exploded perspective view of the first embodiment of the present Invention.
Figure 2:
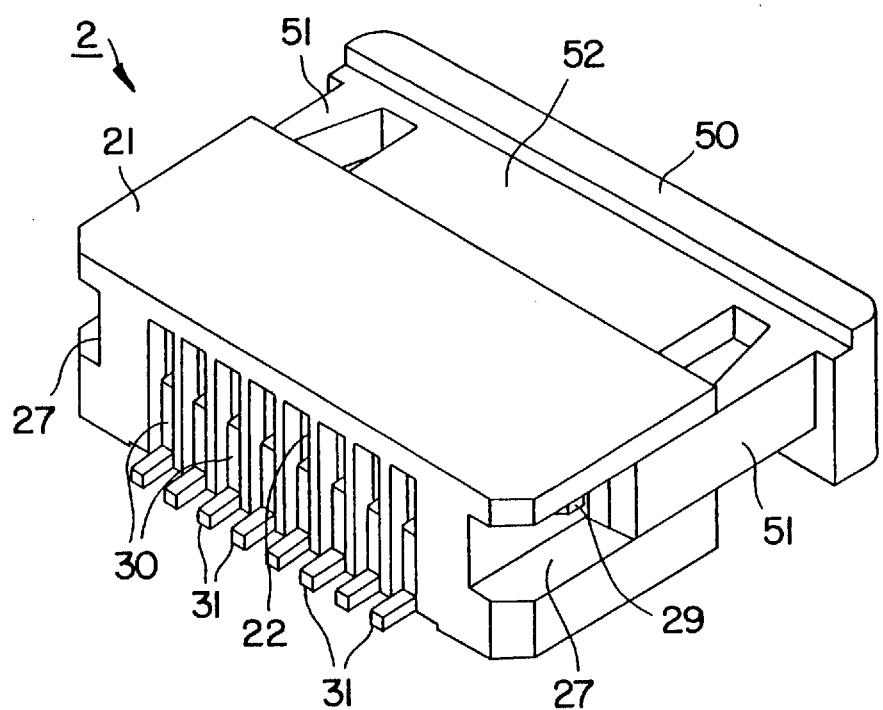
FIG. 2 is a perspective view of the device of FIG. 1 wherein the slide plate is in the initial position.
Figure 3:
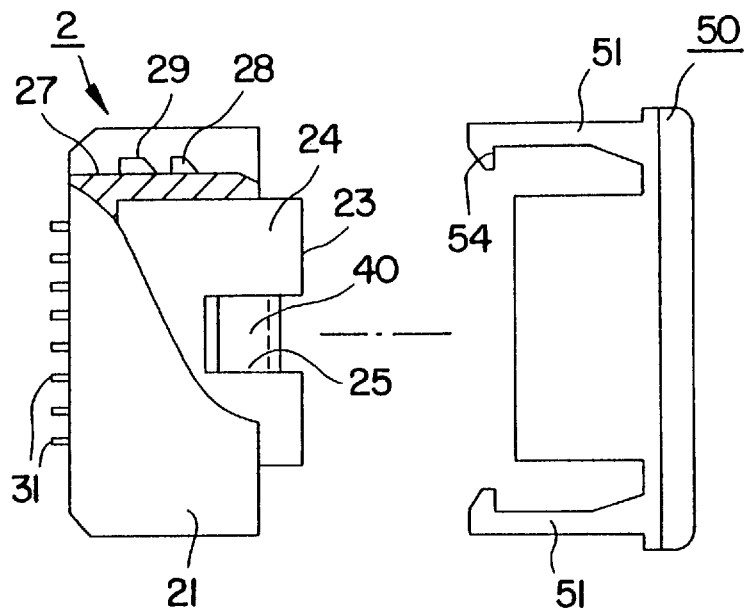
FIG. 3 is a plan view of the device of FIG. 1 wherein the slide member is spaced apart from the remainder of the device, partly in section and with portions broken away for clarity.
Figure 4:
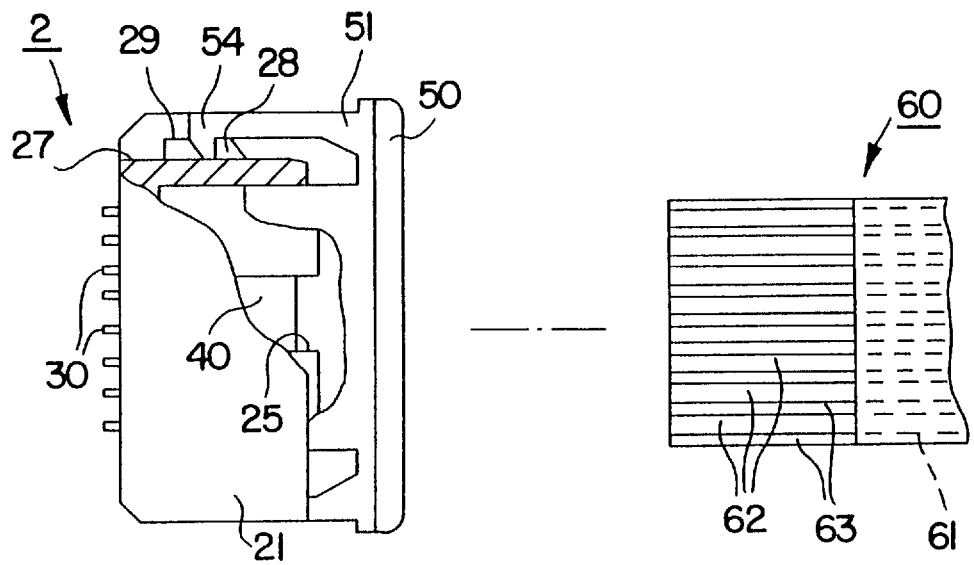
FIG. 4 is a view similar to that of FIG. 3 wherein the slide plate has been inserted to the initial position and showing the flat cable ready for insertion.
Figure 5:
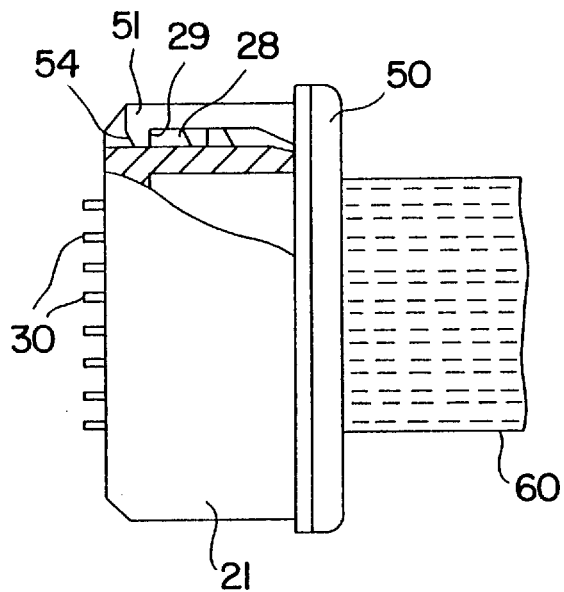
FIG. 5 is a view similar to that of FIG. 4 with the flat cable inserted fully into the device.

Slide 50 is of an insulating material and, as shown particularly in FIGS. 2 and 3, there is a pair of right and left arms 51 on either side of slide plate 52. Arms 51 terminate in stopping projections 54 which engage initial stop 28 and normal stop 29 in guide grooves 27. By this construction, slide 50 can be retained in an initial position and a normal position.

Figure 9:
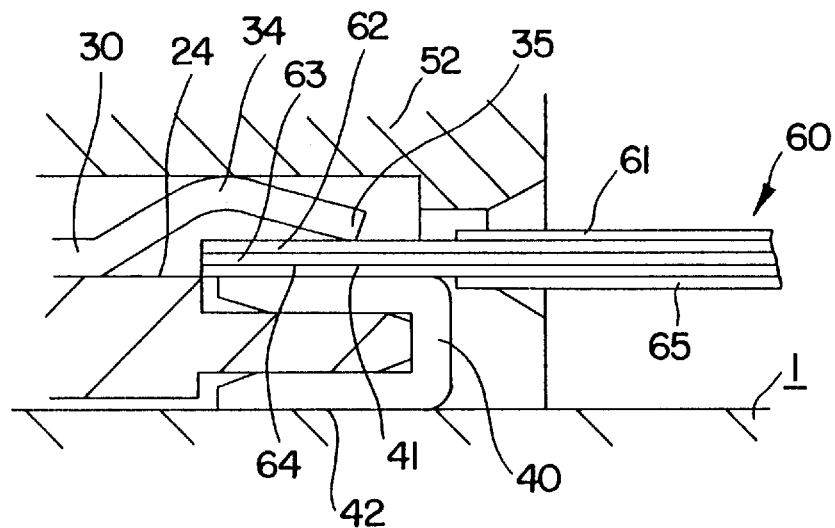
FIG. 9 is an enlarged fragmentary view of FIG. 8.
Figure 10:
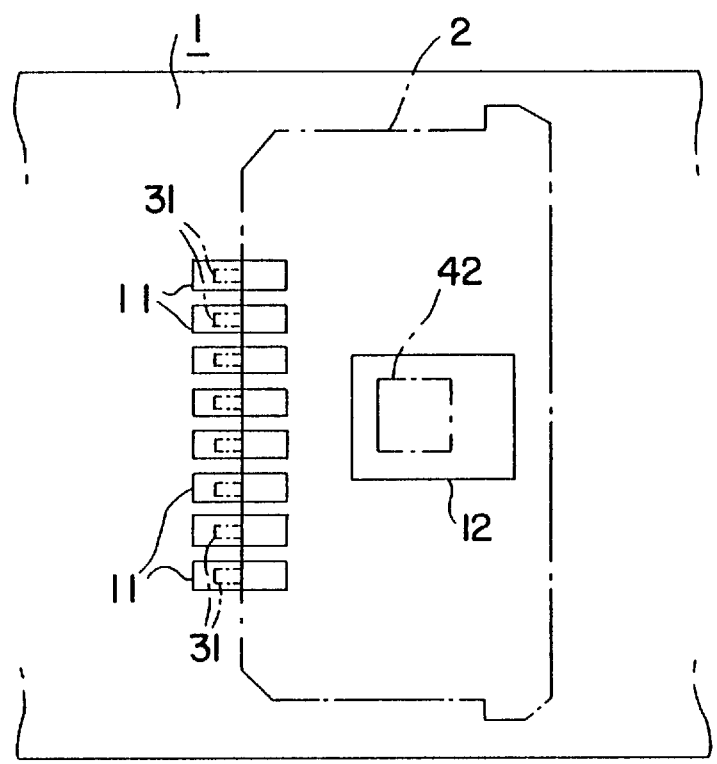
FIG. 10 is a schematic plan view showing the relative positions of the connecting device and the wiring board.
Figure 11:
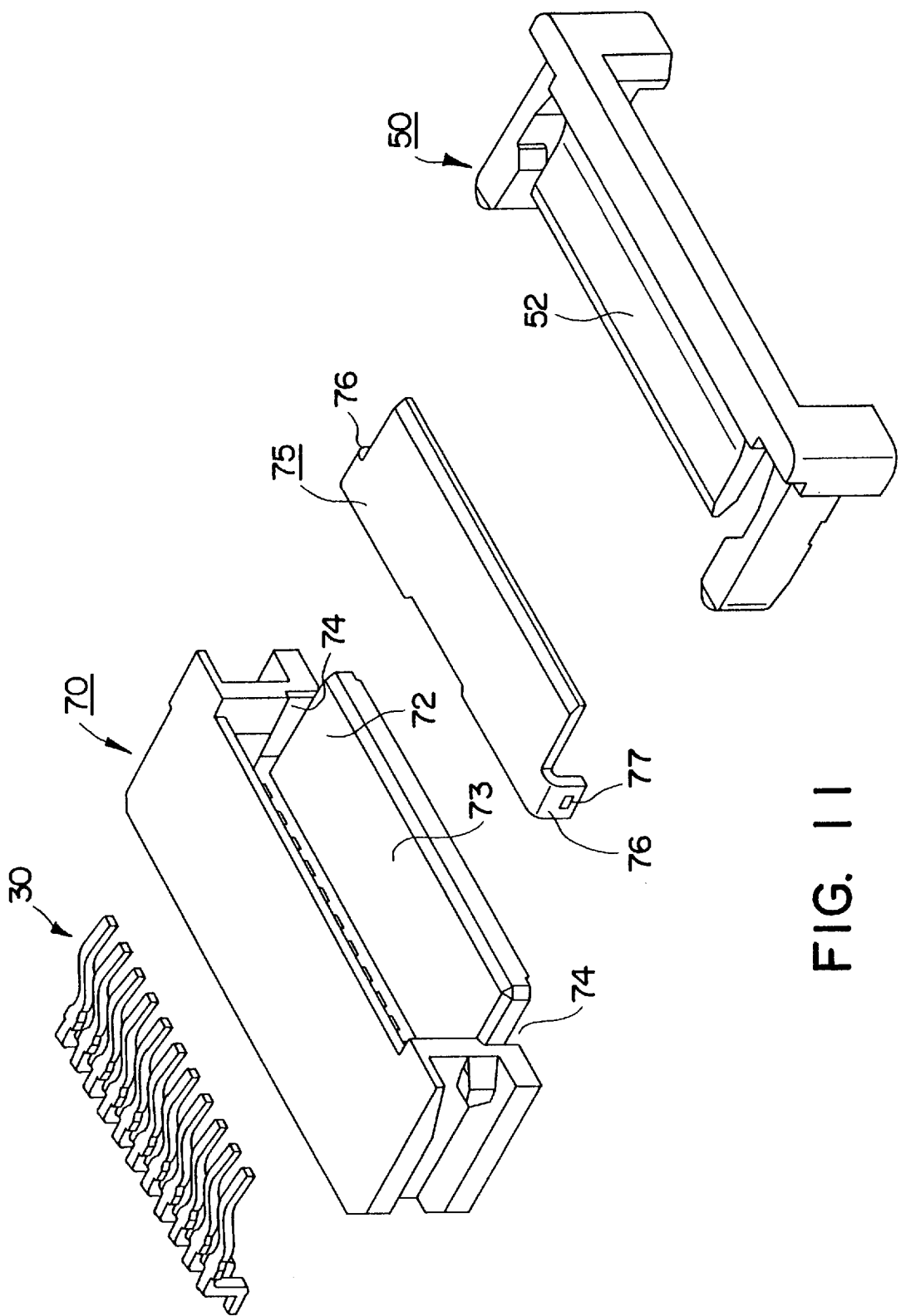
FIG. 11 is an exploded perspective view of another embodiment of the present Invention.
Figure 12:
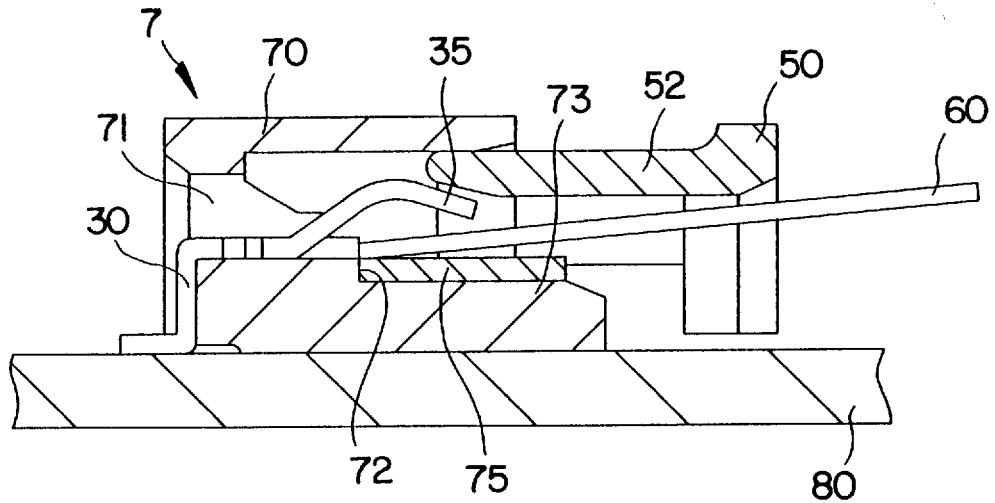
FIG. 12 is a sectional view, similar to that of FIG. 7 in the initial position, but with the cable partially inserted.
Figure 13:
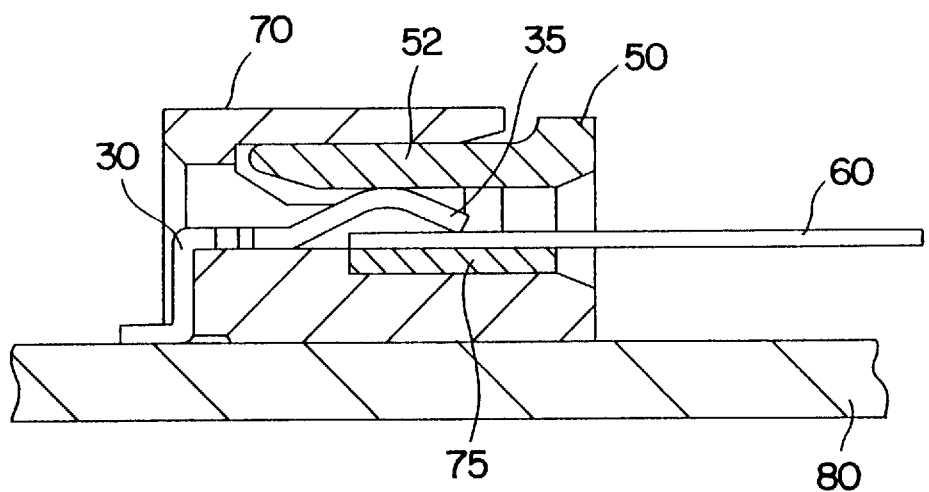
FIG. 13 is a view similar to that of FIG. 12 wherein the slide plate and cable are in their normal position.
Figure 14:
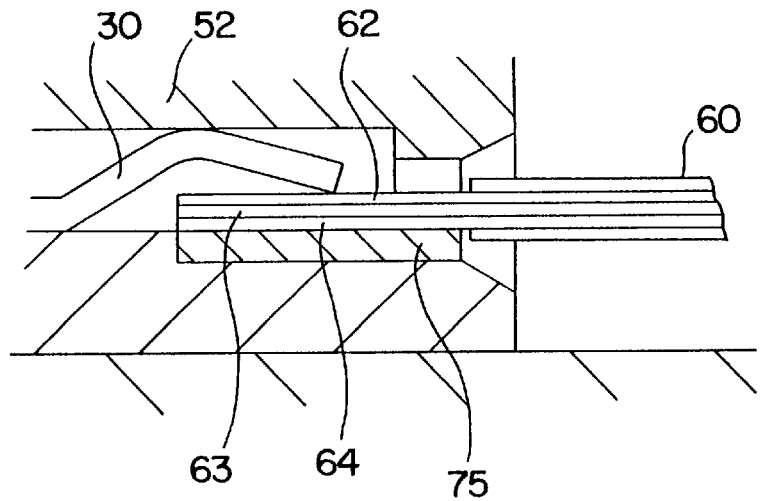
FIG. 14 is a fragmentary enlarged sectional view of FIG. 13.
Figure 15:
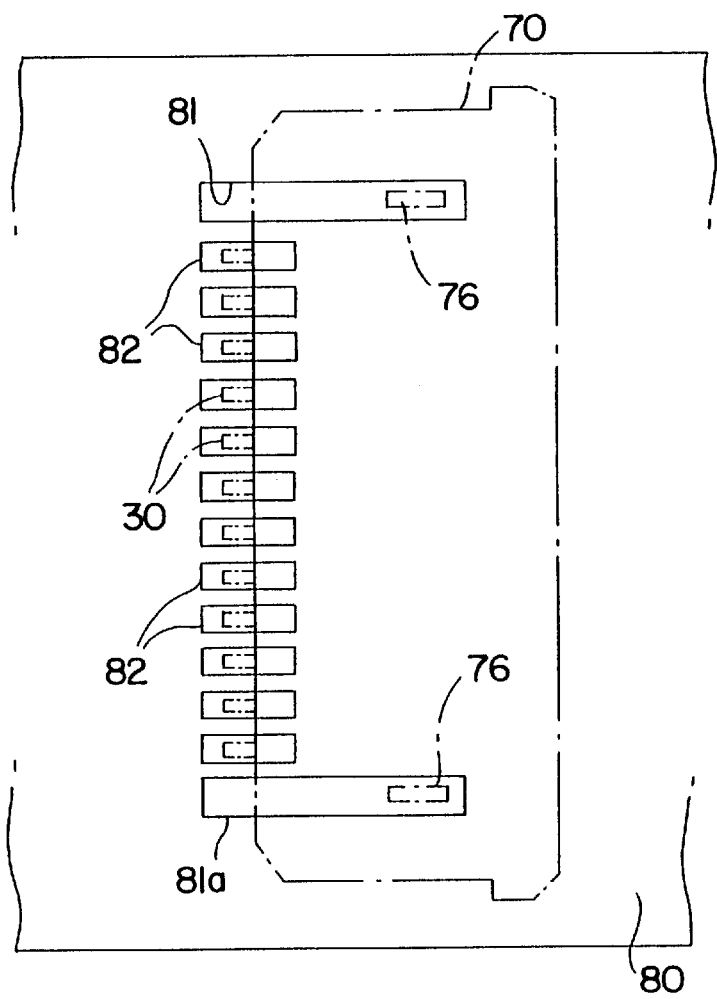
FIG. 15 is a view similar to that of FIG. 10 showing the second embodiment of the Invention.

As shown in FIG. 9, cable 60 comprises first insulating layer 65, shield foil layer 64 thereon, central insulating layer 63, conductors 62, and second insulating layer 61. Thus, cable 60 comprises five flexible laminated layers with first and second insulating layers 65 and 61 terminated before the connecting end so as to expose conductors 62 and shield foil 64.

Figure 7:
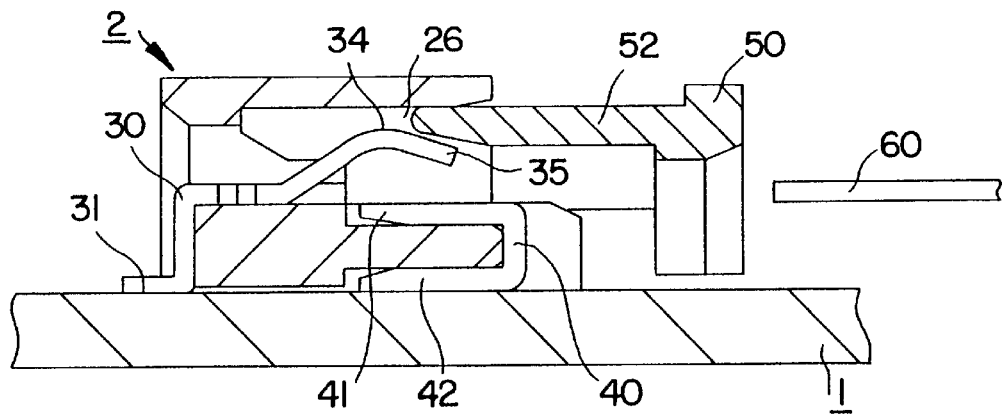
FIG. 7 is a view similar to that of FIG. 6 wherein the slide plate is in the initial position.
Figure 8:
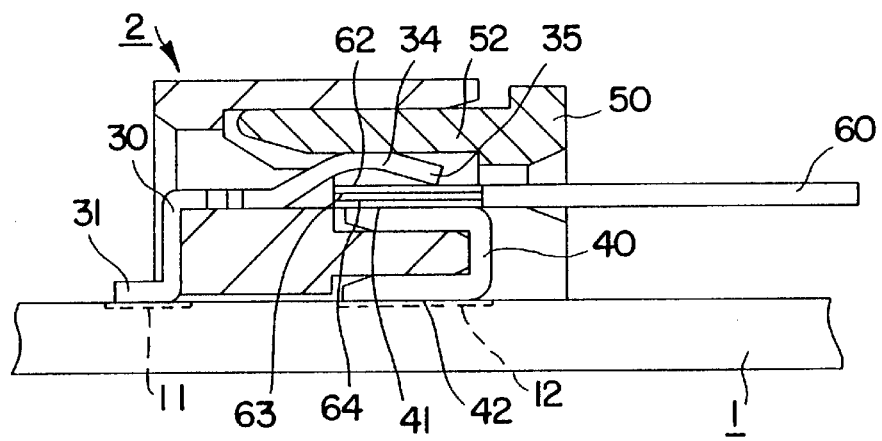
FIG. 8 is a view similar to that of FIG. 7 with the slide plate and the cable fully inserted in the normal position.

To assemble the device, as shown in FIG. 7, terminals 30 and holder 40 are inserted into connecting device 2. Slide 50 is inserted to the initial position. To affix connecting device 2 to wiring board 1 (see FIG. 10), contacts 31 of terminals 30 are placed on wiring board 1 so that each of contacts 31 forms an electrical connection with corresponding circuit contacts 11. In addition, lower contact 42 of holder 40 forms a connection with ground contact 12. Contacts 31 are soldered to their respective circuit contacts 11, and lower contact 42 is soldered to ground contact 12. As a result, fixed terminals 30 and corresponding circuit contacts 11, and holder 40 and ground contact 12, are respectively electrically connected.

The connecting end of flat cable 60 is inserted between the forward portion of fixed terminals 30 and second contact 41. Thereafter, when slide 50 is pushed to the normal position (see FIGS. 8 and 9), slide plate 52 forces pressing portion 34 and terminal contact 35 against conductor 62 of cable 60. This electrically connects circuit contacts 11 with conductors 62 through fixed terminals 30. At the same time, shield foil 64 is in pressure contact with second contact 41 of holder 40. Therefore, shield foil 64 is in electrical contact with ground contact 12 through second contact 41 and first contact 42 of holder 40. Thus, shield foil 64 is well grounded.

Hence, the present Invention provides a connecting device wherein it is unnecessary to have a transversely spaced parallel terminal used for grounding only. This enables a substantial reduction in the width of the cable and also of the width of the connecting device.

In the past, it has been considered necessary to provide the shield foil end piece 144a of the same thickness as conductors 62. However, in the present Invention, since first insulation layer 65 is eliminated at the contact end to expose shield foil 64, cable 60 at connecting device 2 is thinner than the corresponding prior art cable. Moreover, since it is not necessary to have a narrow shield foil end piece 144a, production of cable 60 is facilitated.

While the Invention has been described in terms of fixing connecting device 2 to wiring board 1 after slide 50 has been inserted to the initial position, it is understood that the steps may be reversed and connecting device 2 affixed to wiring board 1 before slide 50 is inserted to the initial position.

A second embodiment of the present Invention is shown in FIGS. 11 to 15. Housing 70 is provided with holder recess 72 stepped down from the front end of cavity 71 having holder receiving surface 73 therein. Surface 73 receives holder 75 and leg grooves 74 receive legs 76. Friction stops 77 bear against housing 70 to retain holder 75. The lower end faces of legs 76 are flush with the lower face of housing 70. A row of circuit contacts 82 (adapted to be connected to terminals 30) are provided on wiring board 80. Ground contacts 81 and 81a are connected to the grounding circuit. Contacts 81 and 81a extend forward beyond circuit contacts 82 to contact legs 76 of holder 75.

Device 70 is placed on wiring board 80 so that contacts 31 correspond to the respective circuit contacts 82. The lower ends of legs 76 meet ground contacts 81 and 81a and are soldered thereto. As a result, fixed terminals 30 and circuit contacts 82 are electrically connected and holder 75 and ground 77 also are electrically connected.

The remainder of the operation of the device is substantially the same as that of the first embodiment and need not be repeated. Similarly, the advantages of this embodiment are those previously set forth. In addition, legs 76 are fixed to ground contacts 81 and 81a and thereby form an excellent and secure connection.

Figure 16:
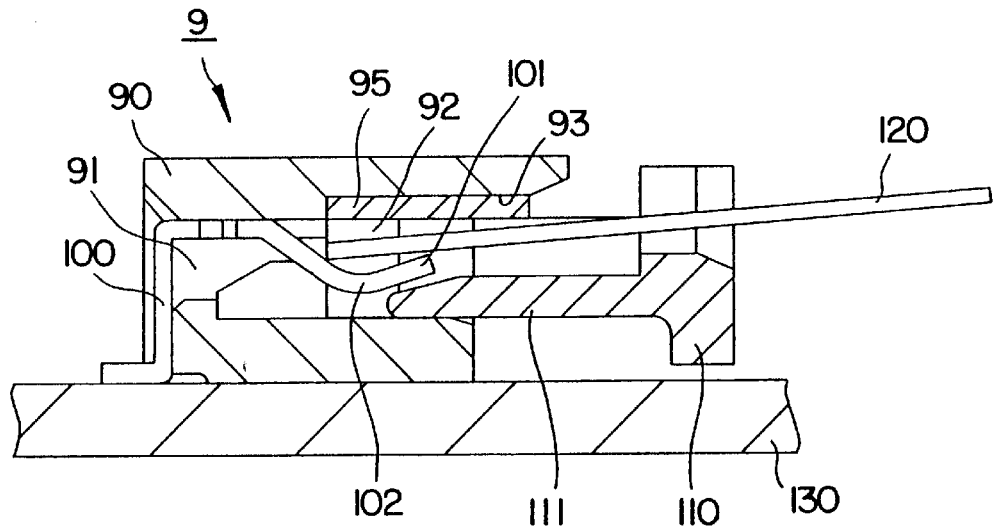
FIG. 16 is a sectional view similar to that of FIG. 12 of a third embodiment of the present Invention.

In yet another embodiment of the present Invention, the slide, terminals, cable, and holder within the device are inverted as compared with the previous embodiments. In FIG. 16, housing 90 of device 9 is provided with cavities 91 and contiguous insertion space 92. Holder recess 93 is located on the upper side of insertion space 92.

Figure 19:
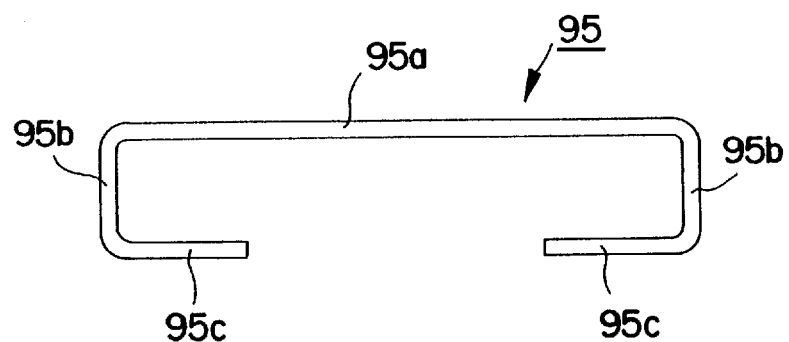
FIG. 19 is a front view of the holder of the third embodiment.

Holder 95 is separately shown in FIG. 19. Planar body 95a carries holder legs 95b depending from both sides. Holder contacts 95c project inward from the lower ends of holder legs 95b and are parallel to body 95a. When inserted into housing 90, body 95a is in contact with the upper face of insertion space 92. Holder contact 95c is flush with the lower face of housing 90. Fixed terminals 100 are bent so that pressing portion 102 is convex in the downward direction and terminal contacts 101 are pressed against flat cable 120. The space between pressing portion 102 and the bottom of insertion space 92 is smaller than the thickness of slide plate 111. Thus, when slide plate 111 on slide 110 is inserted into housing 90, terminal contacts 100 are urged against flat cable 120 and, in particular, terminal contact 101 presses firmly against conductors 124.

As in the other embodiments of the present Invention, slide 110 can be retained at its initial position wherein slide plate 111 does not contact fixed terminals 100 or pressing portions 102. Thus, cable 120 can readily be introduced between terminal contact 101 and body 95a of holder 95.

Cable 120 is similar to cable 60 of the first embodiment; however, the various layers are reversed. Parallel conductors 124 are spaced apart transversely on second insulating layer 125. Central insulation layer 123 is on conductors 124. Shield foil layer 122 surmounts central insulation layer 123 and, in turn, is covered by first insulating layer 121. First and second insulating layers 121 and 125 terminate short of the connecting end of cable 120, thereby providing a contact area within housing 90.

After cable 120 has been inserted into housing 90, slide 95 is moved from its initial position to its normal position. The former is shown in FIG. 16 and the latter in FIGS. 17 and 18. Thus, as can best be seen in FIG. 18, conductors 124 are exposed on the underside of cable 120 at the connecting area. At the same time, shield foil layer 122 is exposed to holder 95 at planar body 95a in recess 93 at the top of insertion space 92.

Figure 20:
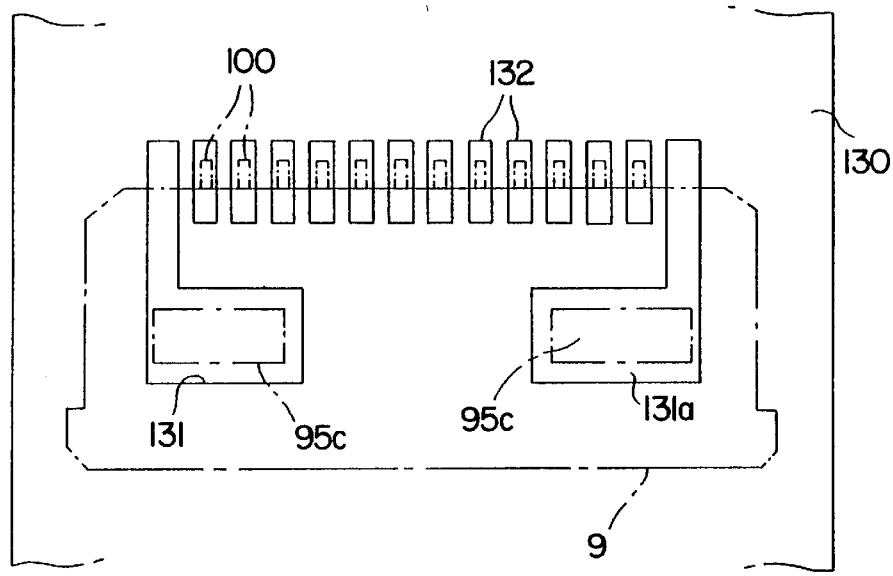
FIG. 20 is a plan view, similar to that of FIG. 10, showing the relative locations of the connecting device and the wiring board.
Figure 21:
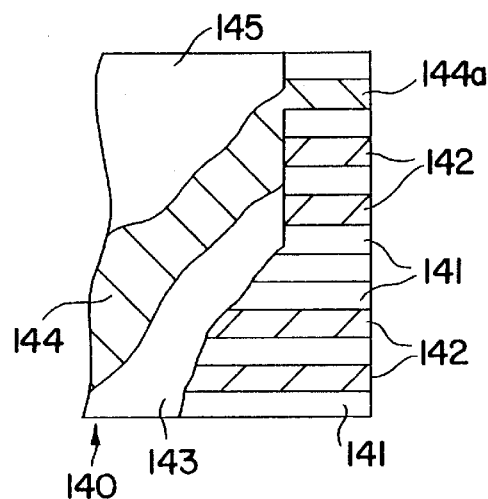
FIG. 21 is a plan view, partially broken away for clarity, of the flat cable of the prior art.
Figure 22:
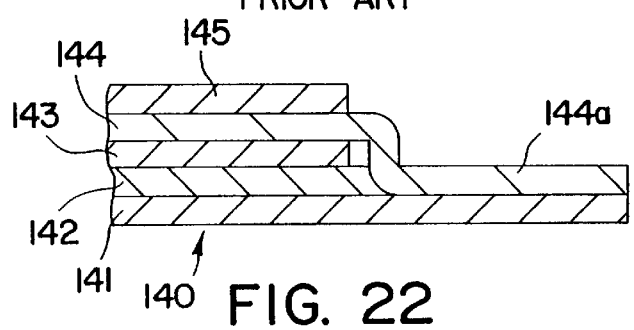
FIG. 22 is a sectional elevation of the prior art flat cable.

Wiring board 130, which is analogous to wiring board 30, is provided (as shown in FIG. 20) with a pair of right and left ground contacts 131 and 131a, each of which is in contact with the grounding circuit; ground contacts 131 and 131a are forward of the line of circuit contacts 132 and are positioned so as to correspond to holder contacts 95c.

To attach device 9 to wiring board 130, fixed terminals 100 are soldered to their respective circuit contacts 132, substantially in the same manner as the previous embodiments. Holder contact 95c is secured to board 130 by soldering to ground contacts 131 and 131a, thus forming an electrical connection between holder 95 and ground contacts 131 and 131a.

Figure 17:
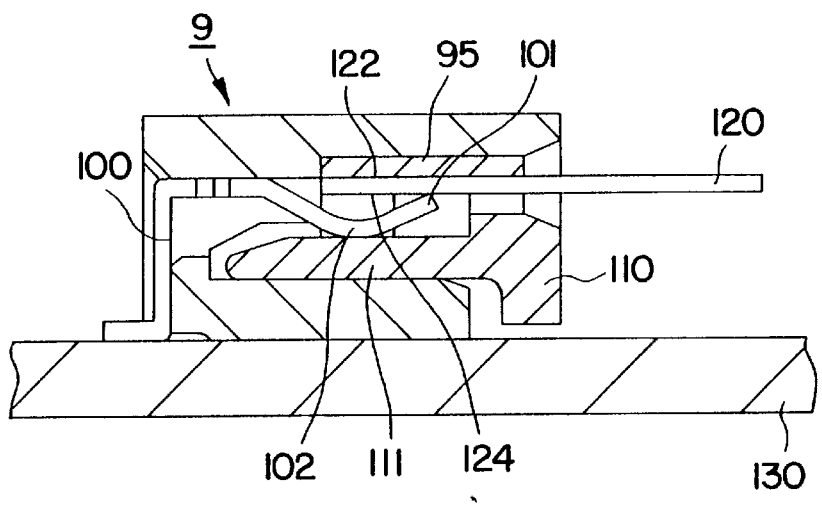
FIG. 17 is a sectional view similar to that of FIG. 13 of the third embodiment of the present Invention.
Figure 18:
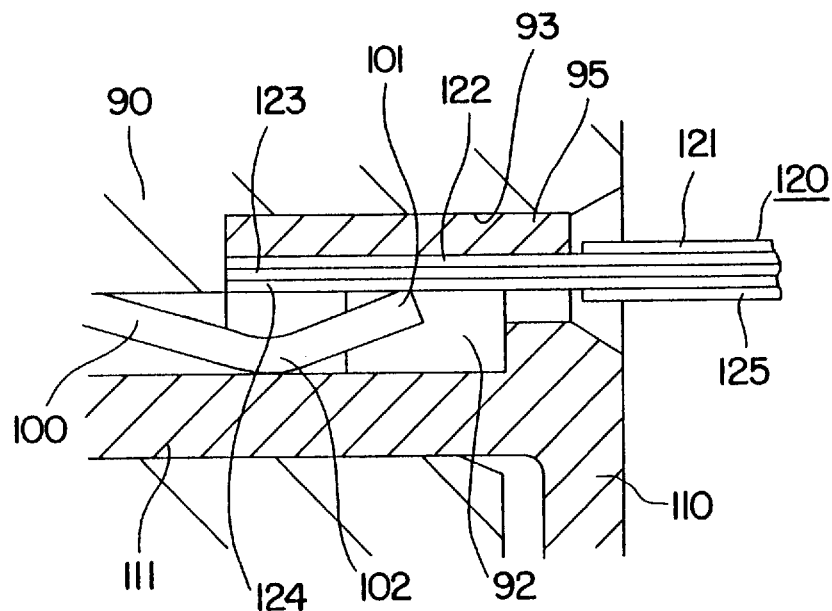
FIG. 18 is a fragmentary enlarged sectional view of FIG. 17.

Thereafter, slide plate 111 is inserted into housing 90 in its initial position, as shown in FIG. 16. In this position, slide 111 exerts no pressure on pressing portion 102 and permits the ready insertion of cable 120 into the space between terminal contacts 101 and holder 95. Once this has been accomplished, slide 110 is pressed fully into housing 90, as shown in FIG. 17. Slide plate 111 now urges pressing portion 102 upwardly and presses terminal contacts 101 against conductors 124 on cable 120. At the same time, the connecting end of cable 120 is firmly pressed against body 95a of holder 95 to insure a good contact therewith.

In the fully installed device (FIGS. 17 and 18), electrical contact exists from shield foil layer 122, through planar body 95a, holder leg 95b, and holder contact 95c to ground contact 131. The construction of the devices of the present Invention insures excellent electrical contacts throughout and minimizes wear on the cables being inserted therein. At the same time, the various elements are firmly retained in the normal position and are prevented from inadvertent release.

While only three embodiments of the present Invention have been expressly disclosed, it is, nonetheless, to be broadly construed, and not to be limited except by the character of the claims appended hereto.

What we claim is:

1. A device for connecting a flat cable to a wiring board wherein said cable comprises a first insulating layer, a shield foil layer thereon, a central insulation layer on said shield foil layer, a plurality of conductors parallel to each other on said central layer, and a second insulating layer on said plurality of conductors, said cable terminating in a connecting end, said first layer and said second layer terminating at points spaced longitudinally away from said connecting end, thereby providing exposed portions of said plurality of conductors and said shield layer, said device comprises a housing and a slide adapted to enter therein, said housing having a plurality of cavities corresponding to said conductors, said cavities extending forwardly in communication with an insertion space, a plurality of fixed terminals, corresponding to said cavities, one of said fixed terminals in each of said cavities, each of said fixed terminals comprising a wiring board contact, projecting rearwardly out of one of said cavities, a pressing element in said insertion space, and a terminal contact forward of said pressing element, said pressing element spaced apart from an inner surface of said insertion space, a holder in said housing having a first contact forming an electrical connection with said wiring board, said holder having a second contact adjacent said insertion space on a side of said pressing portion away from said inner surface, said exposed portions located between said pressing portion and said second contact, a slide plate between said pressing element and said inner surface, said slide plate urging said pressing element toward said second contact whereby said wiring board contact, said pressing element, said terminal contact are electrically connected to each of said conductors, and said first contact and said second contact are in electrical connection with said shield layer, said wiring board carrying a plurality of circuit contacts corresponding to said plurality of said conductors and in electrical contact with said wiring board contacts, said wiring board carrying a ground contact corresponding to said first contact and in electrical contact therewith, said ground contact connected to ground.

2. The device of claim 1 wherein said wiring board contacts are soldered to said wiring board.

3. The device of claim 1 wherein said holder is soldered to said wiring board.

4. The device of claim 1 wherein there are arms on said slide plate which enter guide grooves on said housing and are retained in an initial position by an initial stop in at least one of said grooves which initial stop is engaged by said arms.

5. The device of claim 4 wherein said slide plate is inserted further into said housing to a normal position and said guide grooves carry normal stops which are engaged by said arms and retain said slide plate in said normal position.

6. The device of claim 1 wherein said housing has a holder receiving surface therein, said holder being a generally planar surface and having a leg depending therefrom at at least one side, a leg groove complementary to, and adapted to receive, said leg, an end of said leg remote from said holder constituting said second contact.

7. The device of claim 6 wherein there are two legs, one of each side of said holder, and there are two corresponding leg grooves adapted to receive said legs.

8. The device of claim 7 wherein each said leg carries a friction stop which, when said slide is fully inserted, bears against said housing to resist withdrawal of said slide plate.

9. The device of claim 1 wherein said holder comprises a planar body, a holder leg on at least one side thereof, a holder contact on an end of said holder leg remote from said body, said holder contact being parallel to said body and spaced therefrom by said holder leg.

10. The device of claim 9 wherein there are two said holder legs.

11. A device for connecting a wiring board to a flat cable wherein said cable comprises a first insulating layer, a shield foil layer thereon, a central insulation layer on said shield foil layer, a plurality of conductors parallel to each other on said central layer, and a second insulating layer on said plurality of conductors, said cable terminating in a connecting end, said first layer and said second layer terminating at points spaced longitudinally away from said connecting end, thereby providing exposed portions of said plurality of conductors and said shield layer, said wiring board having a plurality of circuit terminals at ends of a plurality of electrical circuits, and a ground contact at an end of a grounding circuit, a connector fixed to said wiring board by a holder, said connector having a plurality of fixed terminals, spaced apart transversely from, and parallel to, each other, one end of each of said fixed terminals electrically connected to one of said circuit terminals, and another end of each of said fixed terminals electrically connected to one of said conductors, and a holder in said device electrically connected to a ground contact on said wiring board and to said shield foil layer.

* * * * *